United States Patent
Kwak

(10) Patent No.: US 6,677,792 B2
(45) Date of Patent: Jan. 13, 2004

(54) DIGITAL DLL APPARATUS FOR CORRECTING DUTY CYCLE AND METHOD THEREOF

(75) Inventor: Jong-Tae Kwak, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/335,655

(22) Filed: Dec. 30, 2002

(65) Prior Publication Data

US 2003/0218486 A1 Nov. 27, 2003

(30) Foreign Application Priority Data

May 21, 2002 (KR) .......................... 2002-28119

(51) Int. Cl.[7] .............................. H03L 7/06
(52) U.S. Cl. ....................... 327/158; 327/175
(58) Field of Search ................... 327/141, 142, 327/153–156, 158, 159, 161, 163, 175, 291, 299, 354, 362, 376

(56) References Cited

U.S. PATENT DOCUMENTS

| | | | |
|---|---|---|---|
| 5,808,498 A | 9/1998 | Donnelly et al. ........... 327/255 |
| 5,920,510 A | 7/1999 | Yukutake et al. ...... 365/189.05 |
| 5,990,730 A * | 11/1999 | Shinozaki .................. 327/544 |
| 6,061,295 A | 5/2000 | Roh .......................... 365/233 |
| 6,066,969 A * | 5/2000 | Kawasaki et al. .......... 327/156 |
| 6,085,345 A | 7/2000 | Taylor ....................... 714/731 |
| 6,137,328 A * | 10/2000 | Sung .......................... 327/158 |
| 6,229,368 B1 | 5/2001 | Lee ............................ 327/292 |
| RE37,452 E | 11/2001 | Donnelly et al. ........... 327/255 |
| 6,452,432 B2 * | 9/2002 | Kim ........................... 327/158 |
| 2001/0029566 A1 | 10/2001 | Shin .......................... 711/105 |

FOREIGN PATENT DOCUMENTS

| | | |
|---|---|---|
| JP | 08-147967 | 6/1996 |
| JP | 09-006462 | 1/1997 |
| JP | 11-145816 | 5/1999 |
| JP | 11-306757 | 11/1999 |
| JP | 11-353878 | 12/1999 |
| JP | 2000-187522 | 7/2000 |
| JP | 2001-006399 | 1/2001 |
| JP | 2001-236783 | 8/2001 |

* cited by examiner

*Primary Examiner*—My-Trang Nu Ton
(74) *Attorney, Agent, or Firm*—Marshall, Gerstein & Borun LLP

(57) ABSTRACT

A digital DLL apparatus and a method for correcting a duty cycle are disclosed. The digital DLL apparatus for correcting a duty cycle, includes: a buffer for producing a clock input signal; a delay line unit for receiving/delaying the clock input signal and outputting the clock input signal; a blend circuit for bypassing the first clock signal or producing a blended clock signal; a delay model unit for compensating a time difference of an external clock and an internal clock and generating a compensate clock signal; a direct phase detector for generating a first comparison signal; and a phase detector for generating a second comparison signal. The disclosed apparatus can correct the duty error by using the blend circuit and generate an internal clock signal having 50% of duty cycle.

24 Claims, 8 Drawing Sheets

DIGITAL DLL APPARATUS FOR CORRECTING DUTY CYCLE AND METHOD THEREOF

TECHNICAL FIELD

A digital delay locked loop DLL apparatus and a method for correcting a duty cycle are disclosed, which correct the duty cycle used in a semiconductor or a computer system which needs a clock generator for compensating a skew between an external clock and internal clock.

DESCRIPTION OF RELATED ART

A delay locked loop (DLL) is a circuit widely used for synchronizing an internal clock and an external clock in a synchronous memory of a semiconductor memory system. In the synchronous RAM, all operations such as write or read are supposed to be operated at a rising edge. However, certain elements of the semiconductor device cause a timing delay. For synchronizing operation timing at the rising edge in the synchronous RAM, the time delay must be eliminated. The DLL circuit receives the external clock signal and generates the internal clock signal for synchronizing two signals in order to eliminate the timing delay.

Various techniques have been used for controlling a clock signal of the DLL circuit.

At first, Donnelly et al. disclose "At frequency phase shifting circuit for use in a Quadrature clock generator" in U.S. Pat. No. 5,808,498 issued on Sep. 15, 1998 (hereinafter "Donnelly"). Donnelly teaches a phase shifting circuit including: a first differential amplifier having: a pair of field effect transistors configured to from a source coupled pair having a common node, and including a pair of inputs for receiving an input reference signal and complement thereof and a pair of output nodes; first and second current sources coupled respectively between the output nodes and a first supply rail, the first and second current sources sourcing a current value of I amperes: and a third current source coupled between the common node and a second supply rail, the third current source sinking a current value of 2I amperes; a filter circuit coupled across the output nodes, the filter circuit causing the output nodes of the differential amplifier to produce a pair of complementary triangle wave signals in response to the input reference signal and complement thereof; and a comparator having a pair of inputs coupled to receive the pair of complementary triangle wave signals, the comparator generating an output signal having a predetermined phase relationship with the input reference signal in response to a comparison between the pair of complementary triangle wave signals.

Secondly, Japanese patent application (laid open) No. 2001-6399 discloses a semiconductor apparatus including: a phase controller for controlling phase of an external clock and generating an internal clock; a detector for detecting a frequency of the external clock that deviates from a phase control range of the phase frequency; a first operation mode and a second operation mode, which are switched by a control signal inputted from the outside; and an output circuit for outputting a signal without considering a result of the detector in the first operation mode and being became an output state in the second operation mode according to the result of the detector.

Finally, Japanese patent application (laid open) No. 11-353878 teaches a semiconductor apparatus having a clock phase control circuit for generating a second clock, which is delayed as much as a certain phase according to an external clock by controlling a received first clock phase and outputting data synchronized with one of a first clock and second clock, including: a clock frequency analyzer for analyzing a frequency of the first clock by responding to a signal representing an amount of delay of the first clock and outputting a control signal; and a clock selector for selecting a clock between the first clock and the second clock by responding to the control signal.

The above-mentioned conventional DLLs used in the DDR memory control a delay of whole phase based on a standard signal and compensated signal, however, the conventional DLLs cannot correct a phase delay caused by a duty error when data of external clock signal is processing, wherein the duty error is difference between real duty cycle and 50% duty cycle and it may be occurred during processing the external clock.

SUMMARY OF THE INVENTION

A DLL apparatus and a method for correcting a duty error are disclosed which utilize a blend circuit and generate an internal clock having 50% of a duty cycle.

A disclosed digital DLL apparatus for correcting a duty cycle comprises: a buffer for orderly outputting a first internal clock signal which is activated at an edge of clock by receiving an external clock signal; a delay line unit for receiving the first internal clock signal from the buffer, a first detection signal and a second detection signal and outputting a first delayed internal clock signal and second delayed internal clock signal by delaying the first internal clock signal as much as a predetermined delay amount according to the first and second detection signals; a blend circuit for bypassing the first delayed internal clock signal during the second delayed internal clocks signal is not activated and blending the first delayed internal clock signal and the second delayed internal clock signal in order to produce a blended clock signal when the second delayed internal clock signal is activated, wherein the blended clock signal has a phase of a falling edge mediated between falling edges of the first and second delayed internal clock signals; a delay model unit for estimating a delay amount generated during the blended clock signal travels to a data input/output pin (DQ pin) and outputting a compensated clock signal by compensating the blended clock signal based on the estimated delay amount; a direct phase detector for receiving the external clock signal, generating a first detection signal by comparing the external clock signal and the first compensated clock signal and outputting the first detection signal to the delay line unit; and a phase detector for receiving the first delayed internal clock signal and the second delayed internal clocks signal and generating a second detection signal by detecting phases of the first and second delayed internal clock signals.

A disclosed method for correcting a duty cycle comprises: a) determining whether rising edges of an external clock signal and a compensate clock signal are identically matched; b) activating a second delayed internal clock signal when the rising edges are identically matched; c) determining whether rising edges of the first delayed internal clock signal and second delayed internal clock signal are identically matched; and d) generating a blended clock signal having 50% duty cycle by blending phases of the first delayed internal clock signal and second delayed internal clock signal in case that rising edges of the first clock signal and second clock signal are matched identically.

BRIEF DESCRIPTION OF THE DRAWINGS(s)

The above and other features of the disclosed circuitry and methods will become apparent from the following description of the preferred embodiments given in conjunction with the accompanying drawings, wherein.

DETAILED DESCRIPTION OF THE PRESENTLY PREFERRED EMBODIMENTS

Other aspects of the disclosed apparatuses and methods will become apparent from the following description of the embodiments with reference to the accompanying drawings.

Figure 1:
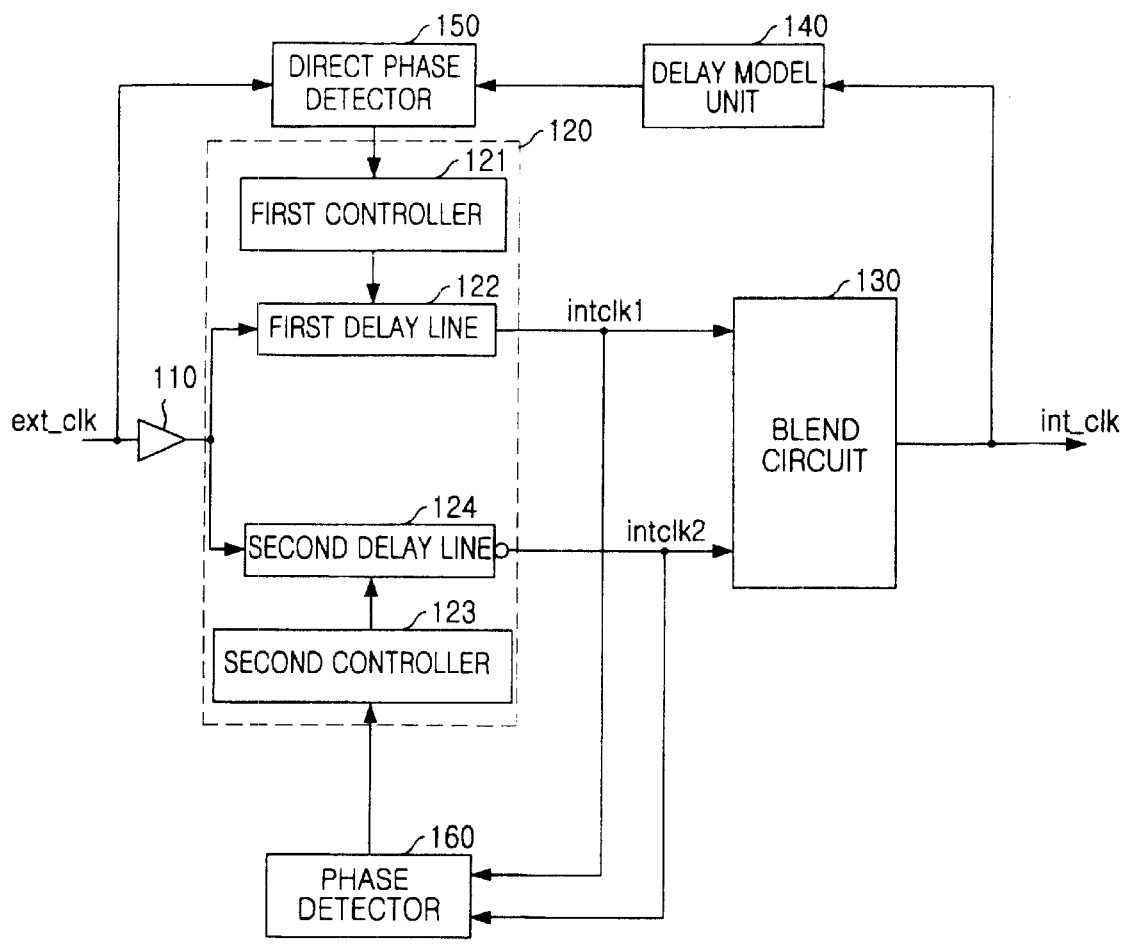
FIG. 1 is a block diagram showing a digital DLL apparatus for correcting a duty cycle in accordance with a preferred embodiment.

FIG. 1 is a block diagram showing a digital DLL apparatus for correcting a duty cycle in accordance with a preferred embodiment. The digital DLL apparatus includes a buffer 110, a delay line unit 120, a blend circuit 130, a delay model unit 140, a direct phase detector 150 and a phase detector 160.

The buffer 110 receives an external clock signal (ext_clk) and generates a first internal clock signal which becomes activated at an edge of a clock. The first internal clock signal is inputted to the delay line unit 120.

The delay line unit 120 receives the first internal clock signal and also receives a first detection signal and a second detection signal from the direct phase detector 150 and the phase detector 160. The delay line unit 120 delays the first internal clock signal based on the first and second detection signals for generating an internal clock signal as the first delayed internal clock signal, which has identical phase of rising edge comparing to the external clock signal. The delay line unit 120 outputs a first delay internal clock signal (intclk1) and a second delayed internal clock signal (intclk2) to the blend circuit 130.

The delay line unit 120 includes a first controller 121, a first delay line 122, a second controller 123 and a second delay line 124.

The first controller 121 generates a first control signal for controlling a delay amount according to the first detection signal and outputs the first control signal to the first delay line 122.

The first delay line 122 receives the first control signal and the first internal clock signal. The first internal clock signal is delayed according to the first control signal in the delay line 122. That is, the delay line 122 generates the first delayed internal clock signal (intclk1) by delaying the first internal clock signal according to the first control signal. The first delayed internal clock signal intclk1 is outputted to the blend circuit 130.

The second controller 123 generates a second control signal for controlling a delay amount according the second detection signal and output the second control signal to the second delay line 124.

The second delay line 124 receives the second control signal and the first internal clock signal. The second delay line 124 delays the first internal clock signal based on the second control signal. By delaying the first internal clock signal, the second delay line 124 generates a second delayed internal clock signal. The second delay clock signal is reversed and a reversed second delayed internal clock signal (intclk2) is outputted to the blend circuit 130.

The blend circuit 130 bypasses the first clock signal (intclk1) during the second delay line 124 is un-activated. If the second delayed internal clock signal is activated, the blend circuit 130 generates a phase blended clock signal (int_clk) by blending the first delayed internal clock signal and the second delayed internal clock signal. That is, the blend circuit 130 shifts falling edges of the first and second delayed internal clock signals to a point, which indicates a half of difference between a falling edge of the first delayed clock signal and a falling edge of the second delayed clock signal. The blended clock signal is outputted to the delay model unit 140 and to an outside of the present invention. The blended clock signal travels to a data input/output pin (DQ pin) through various circuits equipped with a memory system.

The delay model unit 140 receives the blended clock signal (int_clk) and estimates a delay amount generated during the blended clock signal travels to a data input/output pin (DQ pin). The delay model unit 140 generates a compensated clock signal (iclk) based on the estimated delay amount and outputs the compensated clock signal to the direct phase detector 150.

The direct phase detector 150 receives the external clock signal (ext_clk) and the compensated clock signal and generates the first detection signal by comparing the external clock signal (ext_clk) with the compensated clock signal (iclk1). The direct phase detector 150 outputs the first detection signal to the delay line unit 120.

The phase detector 160 receives the first delayed internal clock signal (intclk1) and the second delayed internal clock signal (intclk2) from the delay line unit 120 and generates the second detection signal by detecting phases of the first delayed internal clock signal (intclk1) and the second delayed internal clock signal (intclk2) to the delay line unit 120.

Figure 2:
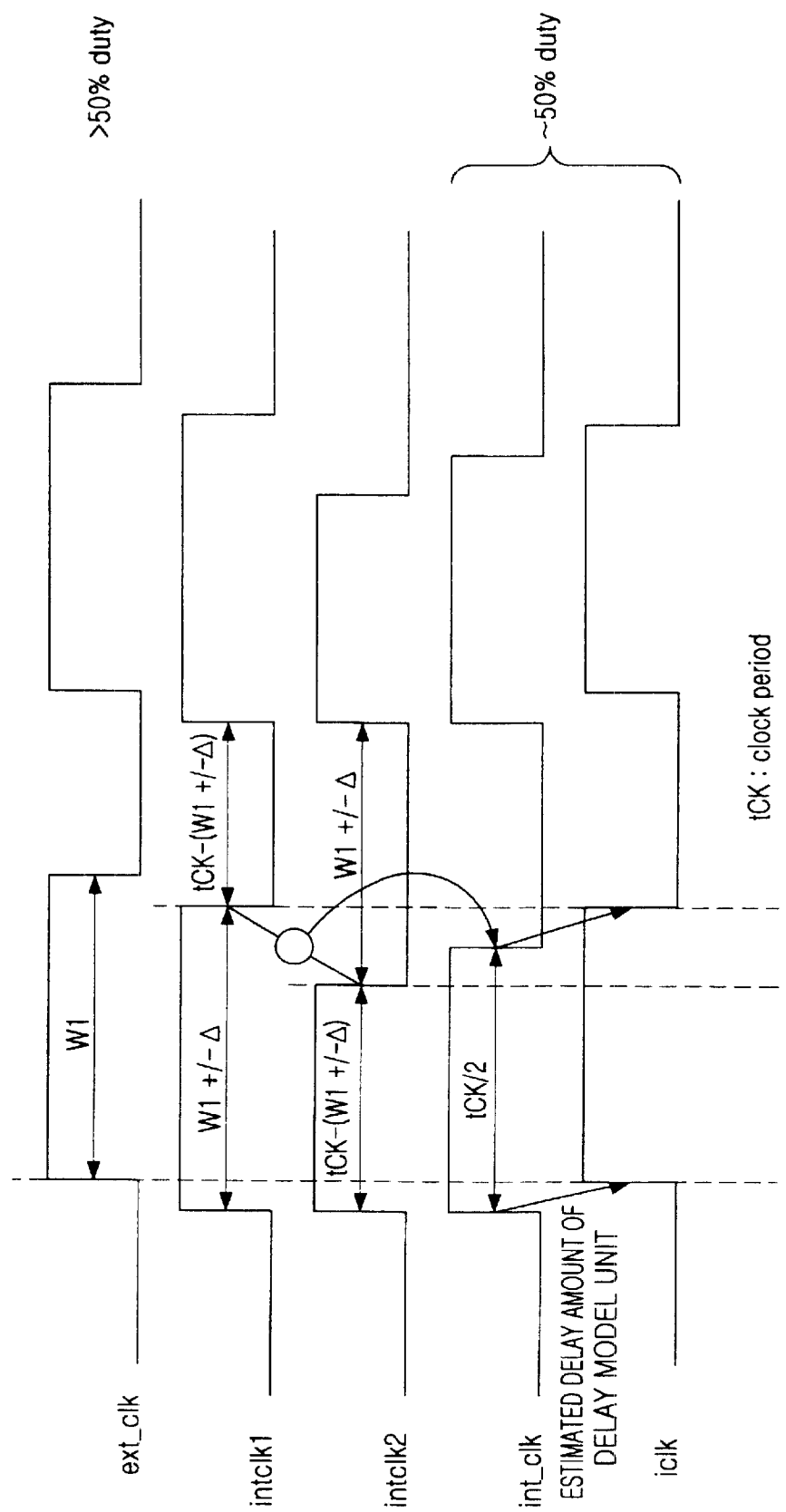
FIG. 2 is a diagram illustrating operations of the digital DLL apparatus correcting the duty cycle in accordance with the preferred embodiment.

FIG. 2 is a timing diagram explaining operations of the digital DLL apparatus correcting the duty cycle in accordance with a preferred embodiment.

Referring to the FIGS. 1 and 2, operations of the digital DLL apparatus correcting the duty cycle is explained in detail as followings.

At first, external clock signals (ext_clk) are stored and buffered in the buffer. The buffer 110 orderly outputs the buffered external clock signals as the first internal clock signal. The first internal clock signal is inputted to the delay line unit 120 and applied to the first delay line 122 and the second delay line 124. At an initial state, the second delay line 124 is not activated. The first delayed internal clock signal (intclk1), which is an output signal of the first delay line 122 is bypassed the blend circuit 130 and converted to the compensated clock signal by the delay mode unit 140. The compensated clock signal is inputted to the direct phase detector 150 and the direct phase detector 150 compares the external clock signal (ext_clk) and the compensated clock signal (iclk). As a result, the direct phase detector 150 generates the first detection signal for controlling a delay amount in order to match rising edges of the external clock signal (ext_clk) and the first internal clock signal at the delay line unit 120. If it is estimated that the rising edges of the external clock signal (ext_clk) and the compensated clock signal are matched, the second delay line 124 is activated. After the second delay line 124 is activated, the second delay line 124 generates the second delayed clock signal (intclk2). The second delayed clock signal (intclk2) is compared with the first delayed clock signal (intclk1) at the phase detector 160. The phase detector 160 generates the second detection signal for controlling the second delay line 124 for matching the rising edges of the first delayed internal clock signal and the second delayed internal clock signal. As shown in FIG. 2, after matching the rising edges of the first and second delayed internal clock signals (intclk1 and intclk2), the blend circuit 130 is activated. That is, the blend circuit 130 bypasses the first delayed internal clock signal (intclk1) at the initial state and after completing to match the rising edges, the blend circuit 130 blends phases of the first and second delayed internal clock signal.

Figure 3:
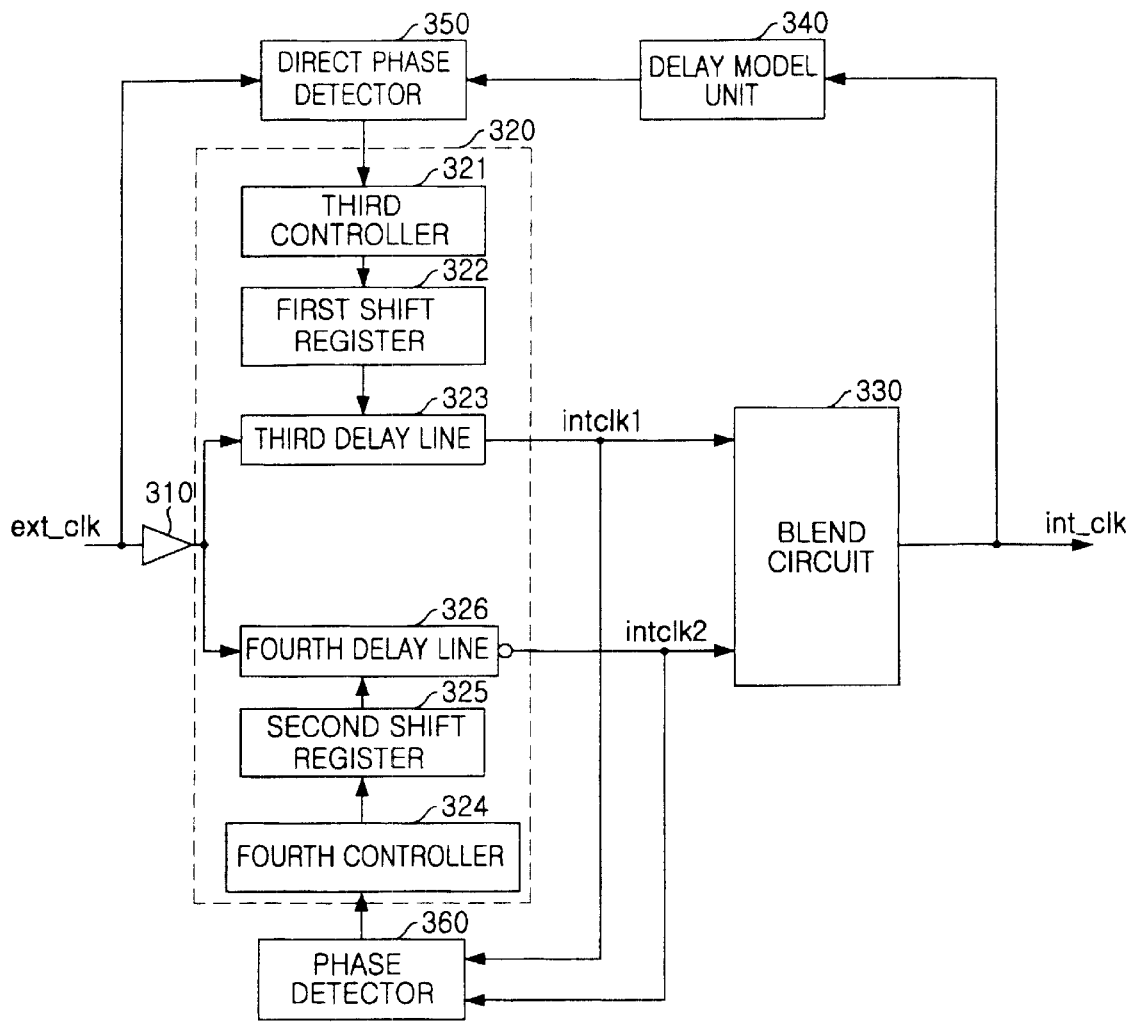
FIG. 3 is a diagram depicting a digital DLL apparatus for correcting a duty cycle in accordance with another embodiment.

FIG. 3 is a diagram illustrating a digital DLL apparatus for correcting a duty cycle in accordance with another embodiment. The digital DLL apparatus includes a buffer 310, a delay line unit 320, a blend circuit 330, a delay model unit 340, a direct phase detector 350 and a phase detector 360.

The buffer 310 receives an external clock signal (ext_clk) and generates a first internal clock signal which becomes activated at an edge of a clock. The first internal clock signal is inputted to the delay line unit 320.

The delay line unit 320 receives the first internal clock signal and also receives a first detection signal and a second detection signal from the direct phase detector 350 and the phase detector 360. The delay line unit 320 delays the first internal clock signal based on the first and second detection signals for generating an internal clock signal as the first delayed internal clock signal, which has identical phase of rising edge comparing to the external clock signal. The delay line unit 320 outputs a first delay internal clock signal (intclk1) and a second delayed internal clock signal (intclk2), which have identical rising edges, to the blend circuit 330.

The delay line unit 320 includes a third controller 321, a first shift register 322, a third delay line 323, a fourth controller 324 and a second shift register 325 and a fourth delay line 326.

The third controller 321 produces a first shift signal for controlling a delay amount of the first internal clock signal according the first detection signal from the direct phase detector 350. The first shift signal is outputted to the first shift register 322.

The first shift register 322 receives the first shift signal and generates a third control signal that controls a delay amount by controlling the third delay line 323. The third control signal is outputted to the third delay line 323.

The third delay line 323 receives the third control signal from the first shift register 322 and the first internal clock input signal from the buffer 310. The third delay line 323 creates a first delayed internal clock signal (intclk1) by delaying the first internal clock signal according to the third control signal and outputs the first delayed internal clock signal (intclk1) to the duty error control unit 330. In other words, the third delay line 323 includes a device having a plurality of unit delay cells, which are coupled in order. The delay amount is controlled by passing the first internal clock signal through a predetermined number of unit delay cells, wherein the predetermined number of unit delay cells are determined and controlled according to the third control signal outputted from the first shift register 322.

The fourth controller 324 produces a second shift signal for controlling a delay amount according to the second detection signal from the phase detector 360. The second shift signal is outputted to the second shift register 325.

The second shift register 325 receives the second shift signal and produces a fourth control signal for controlling a delay amount by moving the output signal to left or right according to the second shift signal. The fourth control signal is outputted to the fourth delay line 326.

The fourth delay line 326 receives the fourth control signal and the first internal clock signal from the buffer 310. The fourth delay line 326 produces a second delayed internal clock signal by delaying the first internal clock signal according to the fourth control signal. After producing, the second delayed internal clock signal is reversed. A second reversed delayed internal clock signal (intclk2) is outputted to the blend circuit 330. That is, the fourth delay line 326 has a device composed of a plurality of unit delay cells, which are coupled in order. The first internal clock signal is delayed by passing the first internal clock signal through a predetermined number of unit delay cells, wherein the predetermined number of unit delay cells are determined and controlled according to the third control signal outputted from the second shift register 325.

The blend circuit 330 bypasses the first clock signal (intclk1) during the fourth delay line 326 is un-activated. If the fourth delay line 326 is activated, the blend circuit 330 generates a phase blended clock signal (int_clk) by blending the first delayed internal clock signal and the second delayed internal clock signal. That is, the blend circuit 130 shifts falling edges of the first and second delayed internal clock signals to a point, which indicates a half of difference between a falling edge of the first delayed clock signal and a falling edge of the second delayed clock signal. The blended clock signal is outputted to the delay model unit 340 and to an outside of the present invention. The blended clock signal travels to a data input/output pin (DQ pin) through various circuits equipped in the memory system including the present invention.

The delay model unit 340 receives the blended clock signal (int_clk) and estimates a delay amount generated during the blended clock signal travels to a data input/output pin (DQ pin). The delay model unit 340 generates a compensated clock signal (iclk) based on the estimated delay amount and outputs the compensated clock signal to the direct phase detector 350.

The direct phase detector 350 receives the external clock signal (ext_clk) and the compensated clock signal and generates the first detection signal by comparing the external clock signal (ext_clk) with the compensated clock signal (iclk1). The direct phase detector 350 outputs the first detection signal to the delay line unit 320.

The phase detector 360 receives the first delayed internal clock signal (intclk1) and the second delayed internal clock signal (intclk2) from the delay line unit 320 and generates the second detection signal by detecting phases of the first delayed internal clock signal (intclk1) and the second delayed internal clock signal (intclk2) to the delay line unit 320.

Figure 4:
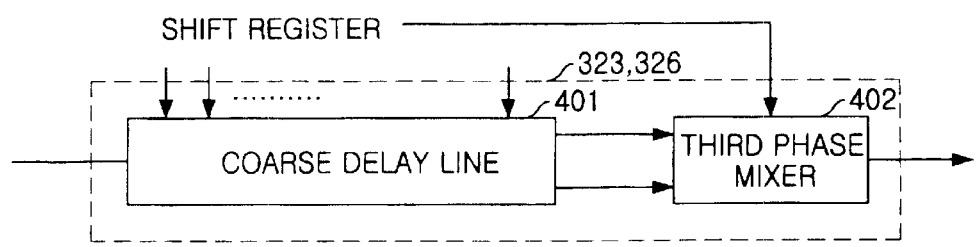
FIG. 4 is a block diagram showing a delay line of FIG. 3.

FIG. 4 is a block diagram showing the third and fourth delay lines 323 and 326 of FIG. 3. The third and fourth delay lines 323 and 326 include a coarse delay line 410 and a first phase mixer 402.

The coarse delay line 401 includes two lines of a plurality of unit delay cells, which are coupled in order. The coarse delay line 401 receives the first internal clock signal and the first internal clock signal becomes a first mixer input signal and a second mixer input signal by being separately inputted to each of two lines of a plurality of unit delay cells. Each of the first and second mixer input signals are passed a predetermined number of activated unit delay cells by the control signal from the first shift register 322. As a result, the first and second mixer input signals are differently delayed according to the number of activated unit delay cells. The first and second mixer input signals are outputted to the first phase mixer 402.

The first phase mixer 402 receives the first and second mixer input signals from the coarse delay line 401 and minutely tunes the delayed amount of two mixer input signals according to the control signals from the third and fourth controller 321 and 324.

Figure 5:
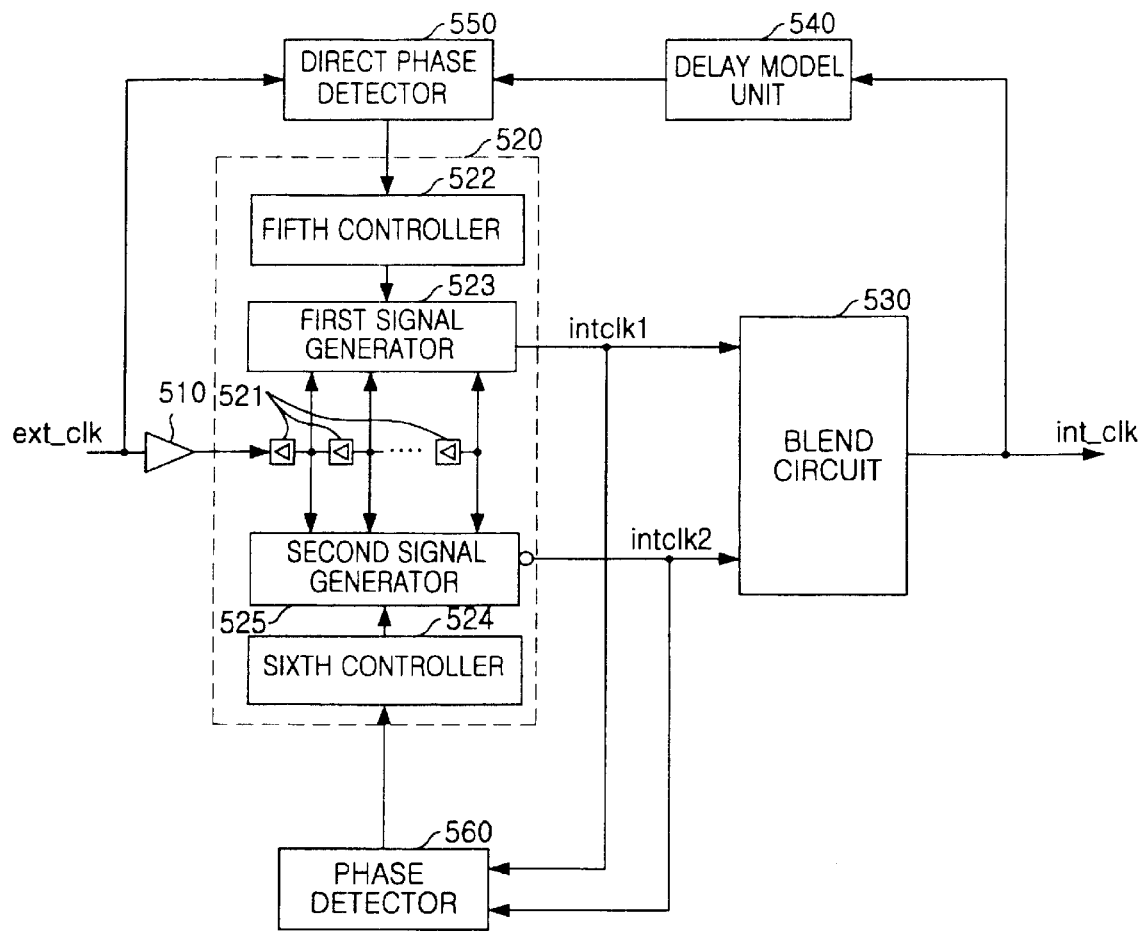
FIG. 5 is a diagram illustrating a digital DLL apparatus for correcting a duty cycle in accordance with still another embodiment.

FIG. 5 is a block diagram illustrating a digital DLL apparatus for correcting a duty cycle in accordance with still another preferred embodiment. The digital DLL apparatus includes a buffer 510, a delay line unit 520, a blend circuit 530, a delay model unit 540, a direct phase detector 550 and a phase detector 560.

The buffer 510 receives an external clock signal (ext_clk) and generates a first internal clock signal which becomes activated at an edge of a clock. The first internal clock signal is inputted to the delay line unit 520.

The delay line unit 520 receives the first internal clock signal from the buffer 510, a first detection signals from the direct phase detector 550 and a second detection signals from the phase detectors 560. The delay line unit 520 delays the first internal clock signal based on the detection signals and outputs a first delayed internal clock signal (intclk1) and a second delayed clock signal (intclk2) to the blend circuit 530.

The delay line unit 520 includes a plurality of delay cells 521, a fifth controller 522, a first signal generator 523, a sixth controller 524 and a second signal generator 525.

The plurality of delay cells 521 receives the first internal clock signal. The first internal clock signal is converted to a plurality of phase delayed signals by passing each of the plurality of delay unit cells 521. Each of a plurality of phase delayed signals has a delay deference as much as a delay amount of one unit delay cell comparing to neighbor phase delayed clock signal. A plurality of the phase delayed signals is outputted to the first and second signal generator 523 and 525.

The fifth controller 522 generates a fifth control signal for controlling a delay amount according to the detection signal from the first direct phase detector 550. The fifth control signal is outputted to the first signal generator 523.

The first signal generator 523 receives the fifth control signal and a plurality of the phase delayed signals from the plurality of delay cells 521. Based on the fifth control signal, the first signal generator 523 selects two neighbored phase delayed signals, which have a delay amount of one delay unit cell, based on the fifth control signal. The first signal generator 523 produces a first delayed internal clock signal (intclk1) by tuning the two neighbored phase delayed signals and outputs the first delayed internal clock signal (intclk1) to the blend circuit 530.

The sixth controller 524 produces a sixth control signal for controlling a delay amount according to the second detection signal from the second direct phase detector 570. The sixth control signal is outputted to the second signal generator 525.

The second signal generator 525 receive the sixth control signal, a plurality of the phase delayed signals from the plurality of the delay cell units 521. Based on the sixth control signal, the second signal generator 525 selects two neighbored phase delayed signals, which have a delay difference as much as one delay unit cell. The two neighbored phase delayed signals are tuned and reversed for generating the second delayed internal clock signal (intclk2). The second delayed internal clock signal (intclk2) is outputted to the blend circuit 530.

The blend circuit 530 bypasses the first clock signal (intclk1) during the second signal generator 524 is un-activated. If the second signal generator 524 is activated, the blend circuit 130 generates a phase blended clock signal (int_clk) by blending the first delayed internal clock signal and the second delayed internal clock signal. That is, the blend circuit 530 shifts falling edges of the first and second delayed internal clock signals to a point, which indicates a half of difference between a falling edge of the first delayed clock signal and a falling edge of the second delayed clock signal. The blended clock signal is outputted to the delay model unit 540 and to an outside of the present invention. The blended clock signal travels to a data input/output pin (DQ pin) through various circuits equipped in the disclosed memory system.

The delay model unit 540 receives the blended clock signal (int_clk) and estimates a delay amount generated during the blended clock signal travels to a data input/output pin (DQ pin). The delay model unit 540 generates a compensated clock signal (iclk) based on the estimated delay amount and outputs the compensated clock signal to the direct phase detector 550.

The direct phase detector 550 receives the external clock signal (ext_clk) and the compensated clock signal and generates the first detection signal by comparing the external clock signal (ext_clk) with the compensated clock signal (iclk1). The direct phase detector 550 outputs the first detection signal to the delay line unit 520.

The phase detector 560 receives the first delayed internal clock signal (intclk1) and the second delayed internal clock signal (intclk2) from the delay line unit 520 and generates the second detection signal by detecting phases of the first delayed internal clock signal (intclk1) and the second delayed internal clock signal (intclk2) to the delay line unit 520.

Figure 6:
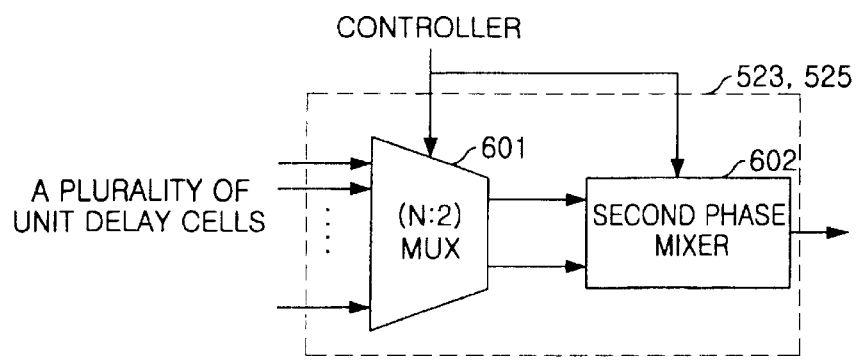
FIG. 6 is a diagram showing a signal generator of FIG. 5 in accordance with still another embodiment.

FIG. 6 is a block diagram showing the first and second signal generators 523 and 525 of FIG. 5. The first and second signal generators 523 and 525 include a MUX 601 and a second phase mixer 602.

The MUX 601 receives a plurality of the phase delay signals and selects two neighbor phase delay signals having a delay amount as much as one unit delay cell according to a control signal from the first and second controllers 522 and 524. The two neighbor signals are outputted to the second phase mixer 602 as a first mixer input signal and a second mixer input signal.

The second phase mixer 602 receives the first and second mixer input signals from the MUX 601 and minutely tunes the delayed amount of the two mixer input signal according to the control signals from the fifth and sixth controllers 522 and 524.

Figure 7A:
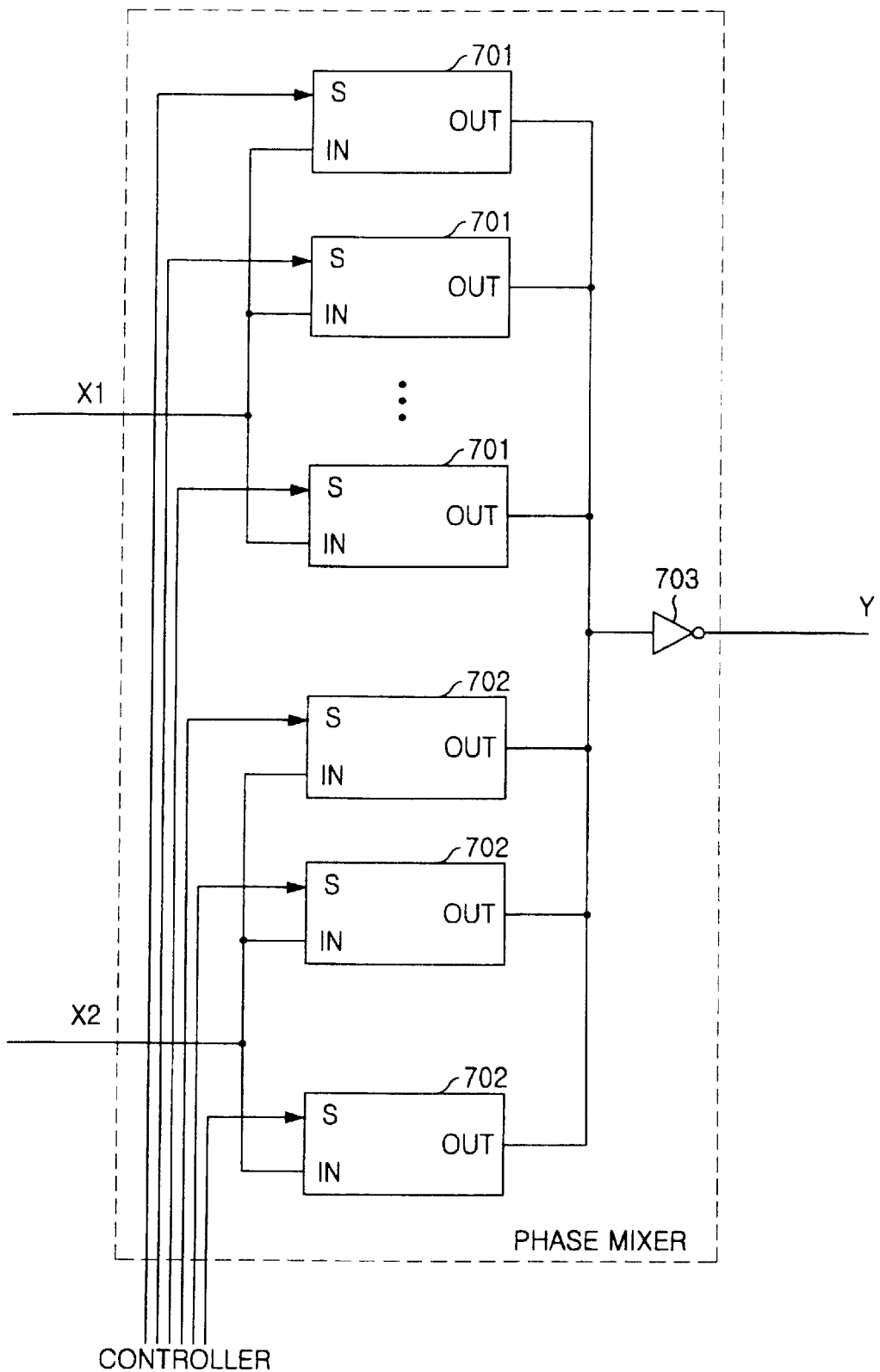
FIGS. 7A and 7B are block diagram depicting the phase mixer of FIGS. 4 and 5.
Figure 7B:
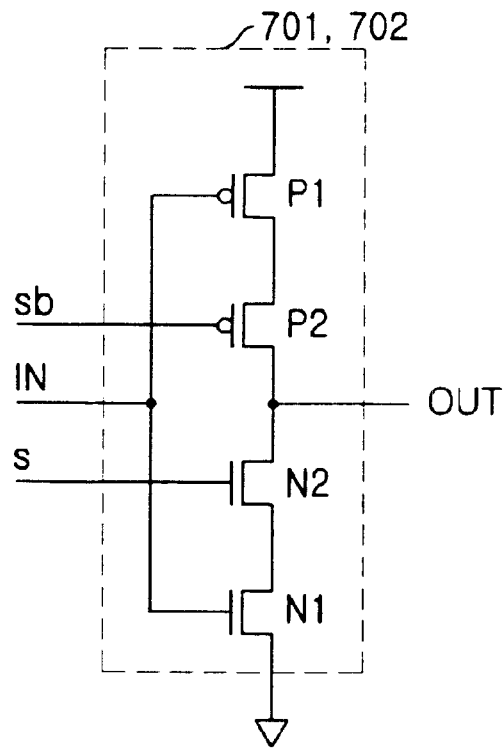
Figure 7C:
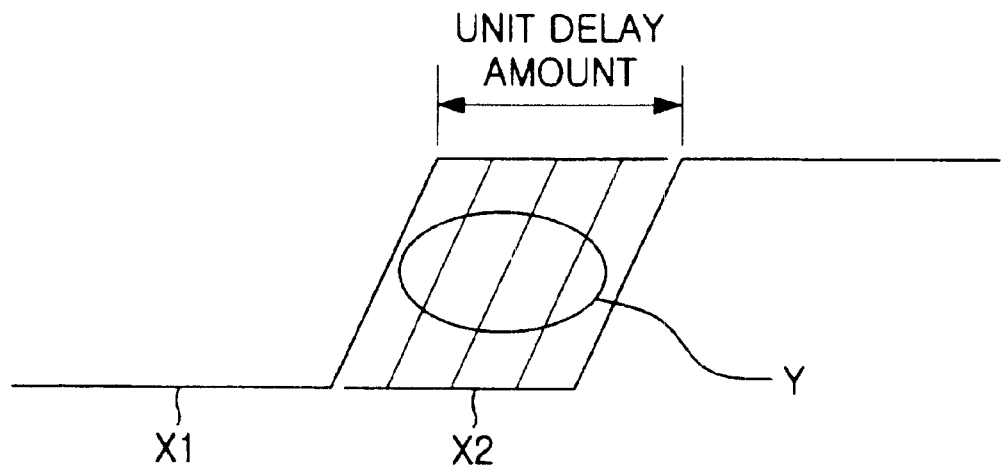
FIG. 7C shows operation concept of the phase mixer of FIGS. 4 and 5.

FIGS. 7A and 7B are block diagrams showing a phase mixer and FIG. 7C is a circuit diagram explaining operations of the phase mixer of FIG. 7A. The phase mixer in FIG. 7A is used as the third and second phase mixers 502 and 602 in FIGS. 4 and 6. The phase mixer is explained in detail as followings.

The second and first phase mixer receive two delayed clock signals as a first mixer input signal and a second mixer input signal from the MUX 601 in FIG. 6 and the coarse delay line 401 in FIG. 4. Referring to FIG. 4, the first internal clock signal is inputted to the coarse delay line 401 and it is passed two divided lines of unit delay cells. Two divided lines in unit delay cells generate two delayed clock signals. The two delayed clock signals have a delay difference and are inputted to the first phase mixer 402. In case of the second phase mixer 602, the phase delayed clock signals are inputted to the MUX 601. The MUX selects two neighbor clock signals having a delay difference as much as a delay amount of one delay unit cell. The two neighbor clock signals are inputted to the second phase mixer 602 as the first mixer input signal and the second mixer input signal.

Referring to FIG. 7A, the phase mixer includes a plurality of first mixing cells 701 and a plurality of second mixing cells 702.

A plurality of first mixing cells 701 receives control signals from the controllers 321, 324, 522, 524 to a first input end S and receives a first mixer input signal X1 to second input end IN. The plurality of first mixing cells 701 outputs a signal High-Z when the control signal is low and when the control signal is high, the plurality of first mixing cells 701 inverses the first mixer input signal and output an inversed first mixer input signal Xi.

A plurality of second mixing cells 702 receives control signals from the controllers 321, 324, 522, 524 to a first input end S and receives a second mixer input signal X2 to second input end IN. The plurality of second mixing cells 702 outputs a signal High-Z when the control signal is high and when the control signal is low, the plurality of second mixing cells 702 reverses the second mixer input signal X2 and outputs the reversed second mixer input signal X2.

Two plurality of mixing cells 701 and 702 receives two signals X1 and X2, which have differently delayed, and outputs the selected mixer input signal, which has mediate phase of two signals X1 and X2 according to the blend circuit 330 or 530. The phase of the selected mixer input signal can be controlled to be any of phases between two signals X1 and X2 by the control signals.

FIG. 7B is a detailed diagram showing a mixing cell in FIG. 7A.

Referring to FIG. 7B, the plurality of first and second mixing cells 701 and 702 includes a first PMOS transistor P1, a second PMOS transistor P2 a first NMOS transistor N1 and a second NMOS transistor N2.

The first PMOS transistor P1 includes a source port and a gate port. The source port is coupled to an electric voltage and one of the first and second mixer input signals received to the gate port.

The second PMOS transistor P2 includes a source port, a drain port and a gate port. The source port of the second PMOS transistor P2 is coupled to a drain ort of the first PMOS transistor P1, the drain port is coupled to an output port OUT. The gate port, receives a reversed control signal (sb) by reversing the control signal.

The first NMOS transistor N1 includes a source port and a gate port. The source port is coupled to a ground and one of the first and second mixer input signals are inputted to the gate port.

The second NMOS transistor N2 includes a source port, a drain port and a gate port. The source port is coupled to the drain port of the first NMOS transistor N1, the control signal (s) is received to the gate port and the drain port is coupled to an output port OUT.

FIG. 7C is a view showing operation of the phase mixers 402 and 602 of FIGS. 4 and 6. The phase mixer receives the first mixer input signal X1 and the second mixer input signal X2 and outputs a clock signal Y having mediate phase of the first and second mixer input signals. In other word, the phase mixer finely divides a phase between the Xi and X2 and outputs a signal having one of phase among finely divided phases in between the phases of the X1 and X2 according to the control signal.

Figure 8:
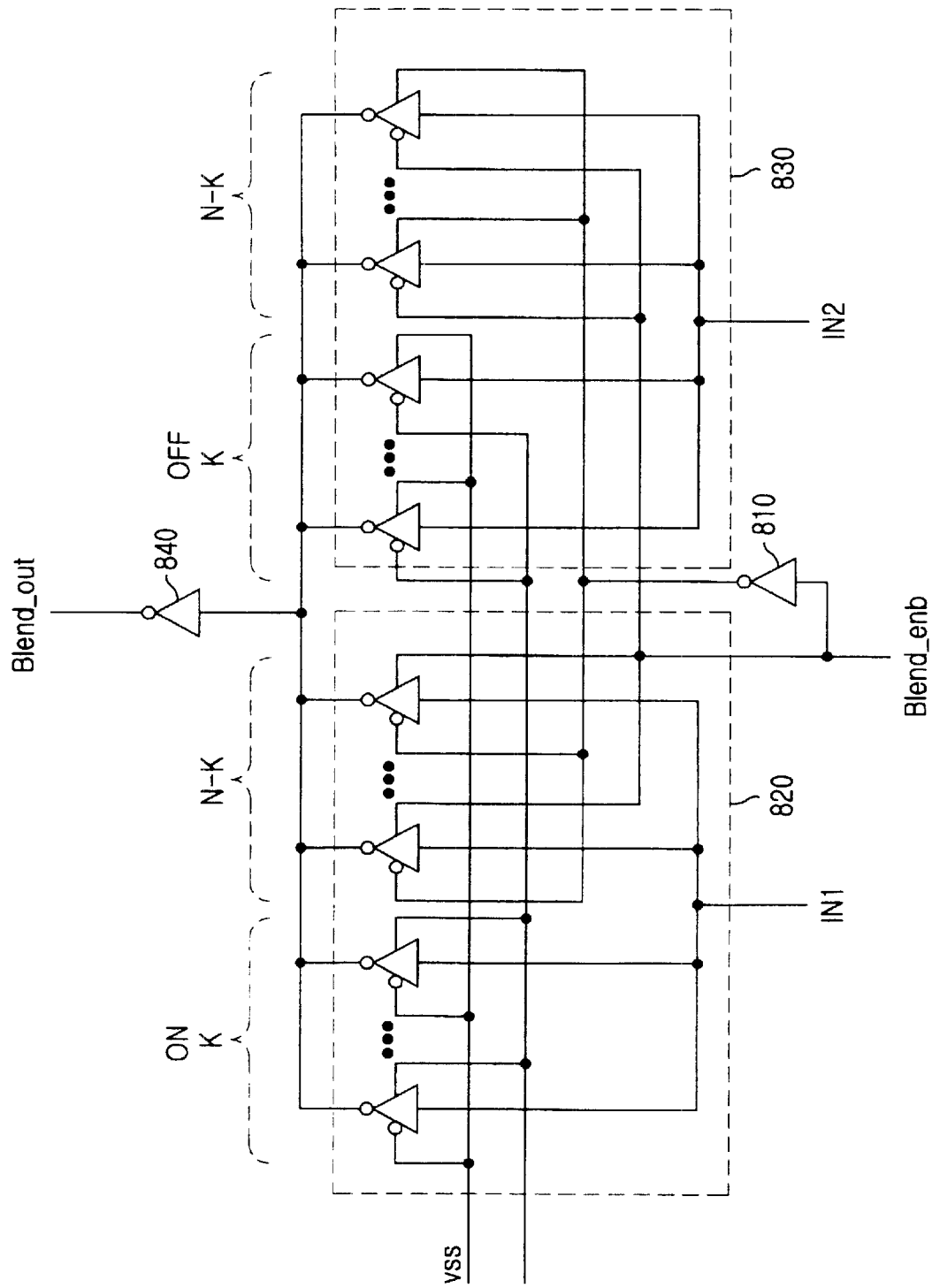
FIG. 8 is a detailed diagram showing a blend circuit for correcting duty cycle in accordance with a preferred embodiment.

FIG. 8 is a diagram showing blend circuit 130, 330 and 530 equipped in a digital DLL apparatus for correcting a duty cycle in accordance with a preferred embodiment.

Referring to the FIG. 8, the blend circuit includes a first clock signal processing unit 820, a second clock signal processing unit 830, a second inverter 810 and a third inverter 840.

The second inverter 810 receives a blended enable signal (Blend_enb) and outputs a reversed blended enable signal by reversing the blended enable signal (Blend_enb).

The first clock signal processing unit 820 receives and bypasses the first delayed internal clock signal when the blended enable signal (Blend_enb) is a second logical step. However, in case the received blended enable signal (Blend_enb) is a first local step, the first clock signal processing unit 820 generates a first blended signal by using the first delayed internal clock signal and outputs the first blended signal to a third inverter 840. The first clock signal processing unit 820 includes k number of first controllable inverters and n-k number of second controllable, inverters. The first controllable inverter is always operated as an inverter. The second controllable inverter is operated as an inverter when the blended enable signal (Blend_enb) is the second logical state and becomes turned off when the blend enable signal (Blend_enb) is the first logical state.

The second clock signal processing unit 830 is not activated when the blended enable signal (Blend_enb) is the second logical step. When the blended enable signal (Blend_enb) is the first logical state, the second clock signal processing unit 830 generates a second blended signal by using the second internal delayed clock signal and outputs the second blended signal to a third inverter 840. The second clock signal processing unit 830 includes k number of third control inverters, which is always turned on, and n-k number of fourth control inverters, which is operated as an inverter in case that the blended enable signal (Blend_enb) is the first logical state and which is turned off in case that the blended enable signal (Blend_enb) is the second logical state.

A third inverter 840 generates the blended clock signal (int_clk) by combining and reversing the first blended signal and second blended signal.

Figure 9:
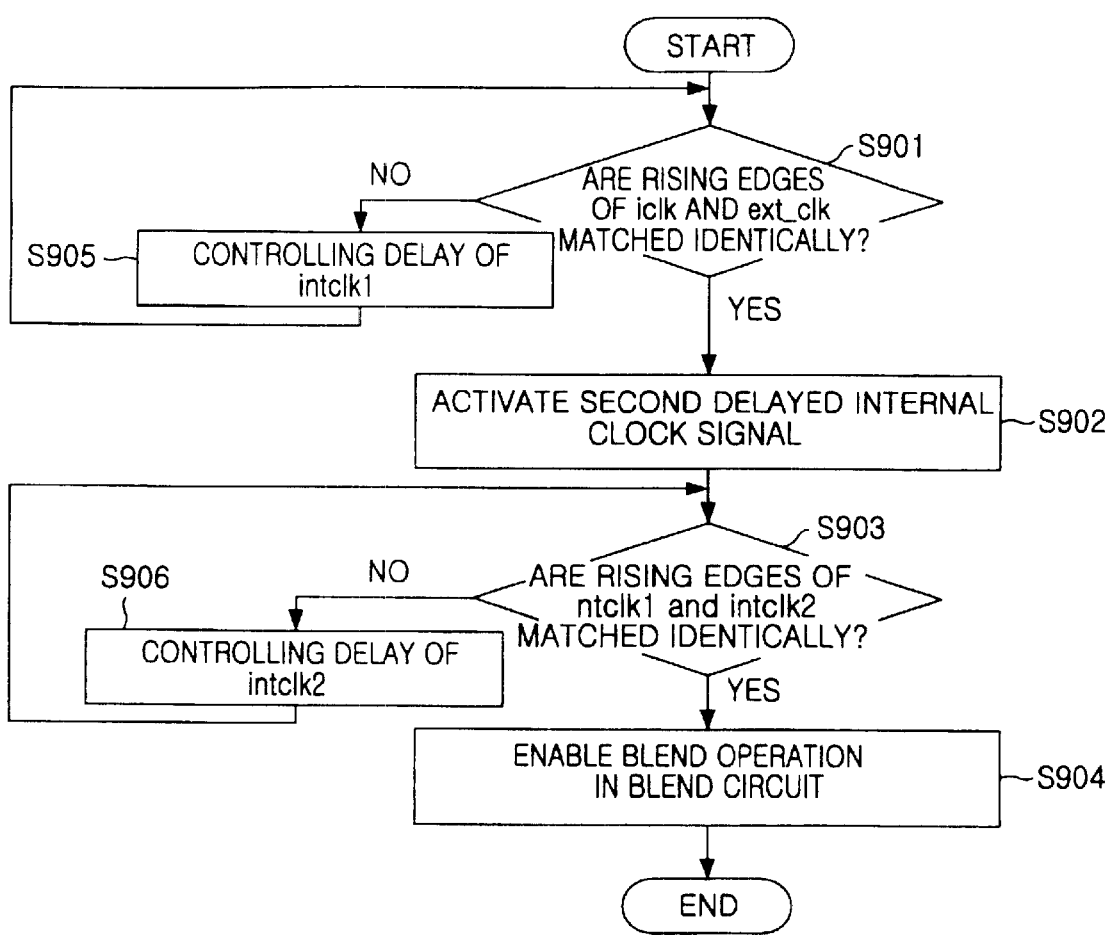
FIG. 9 is a flowchart for explaining operations of a digital DLL apparatus for correcting a duty cycle in accordance with a preferred embodiment.

FIG. 9 is a flowchart explaining a method of digital DLL apparatus for correcting a duty cycle in accordance with a preferred embodiment of the present invention.

Referring to the FIG. 9, the direct phase detector 150 determines whether the rising edges of the external clock signal (ext_clk) and the compensated clock signal (iclk) are matched identically at a step of S901.

If the rising edges are matched identically, the second delayed internal clock signal (intclk2) is generated by activating the second delay line 124 at a step of S902.

After the step of S902, the rising edges of the first delayed internal clock signal (intclk1) and the second delayed internal clock signal (intclk2) are determined whether the rising edges are matched identically at a step of S903.

If the rising edges of the first delayed internal clock signal (intclk1) and the second delayed internal clock signal (intclk2) is matched identically, the blend circuit 130 produces the blended clock signal having 50% as duty cycle by blending the first and second delayed internal clock signal in order to match the falling edges of the first and second delayed internal clock signals at a step of S904.

If the rising edges of the external clock signal and compensated clock signal are not matched identically, then the external clock signal and the compensated clock signal are delayed for matching the rising edges at step 905. After delaying, the rising edges of the external clock signal and compensated clock signal is determined whether they are matched identically at a step of S901.

If the rising edges of the first clock signal (intclk1) and the second clock signal (intclk23) are not matched at step 903, then the second delayed internal clock signal (intclk2) is delayed for matching the rising edges at step 906. After delaying the second delayed internal clock signal (intclk2), the rising edges of the first and second delayed internal clock signals (intclk1 and intclk32) are determined whether they are matched identically at a step of S903.

If the rising edges of the first delayed internal clock signal (intclk1) and the second delayed internal clock signal (intclk2) is matched identically, the blend circuit 130 produces the blended clock signal having 50% as duty cycle by blending the first and second delayed internal clock signal at a step of S904.

As mentioned above, the disclosed circuitry and methods can correct duty error by using the blend circuit and generate an internal clock signal having 50% of duty cycle.

While the disclosed circuitry and methods have been described with respect to certain preferred embodiments, it will be apparent to those skilled in the art that various changes and modifications may be made without departing from the scope of this disclosure which is intended to be limited only by the following claims.

What is claimed is:

1. A digital DLL apparatus for correcting a duty cycle, comprising:
   a buffer for orderly outputting a first internal clock signal which is activated at an edge of clock by receiving an external clock signal;
   a delay line unit for receiving the first internal clock signal from the buffer, a first detection signal and a second detection signal and outputting a first delayed internal clock signal and second delayed internal clock signal by delaying the first internal clock signal as much as a predetermined delay amount according to the first and second detection signals;
   a blend circuit for bypassing the first delayed internal clock signal during the second delayed internal clock signal is not activated and blending the first delayed internal clock signal and the second delayed internal clock signal in order to produce a blended clock signal when the second delayed internal clock signal is activated, wherein the blended clock signal has a phase of a falling edge mediated between falling edges of the first and second delayed internal clock signals;
   a delay model unit for estimating a delay amount generated during the blended clock signal travels to a data input/output pin (DQ pin) and outputting a compensated clock signal by compensating the blended clock signal based on the estimated delay amount;
   a direct phase detector for receiving the external clock signal, generating the first detection signal by comparing the external clock signal and the first compensated clock signal and outputting the first detection signal to the delay line unit; and
   a phase detector for receiving the first delayed internal clock signal and the second delayed internal clocks signal and generating the second detection signal by detecting phases of the first and second delayed internal clock signals.

2. The apparatus as recited in the claim 1, wherein the delay line unit comprises:
   a first controlling means for generating a first control signal for controlling a delay amount according to the first detection signal;
   a first delay line for receiving the first control signal and the first internal clock signal from the buffer and generating the first delayed internal clock signal by delaying the first internal clock signal as much as a predetermined delay amount according to the first control signal;
   a second controlling means for generating a second control signal for controlling a delay amount according to the second detection signal; and
   a second delay line for receiving the second control signal and the first internal clock signal from the buffer, generating the second delayed internal clock signal by delaying the first internal clock signal according to the second control signal and outputting the second delayed internal clock signal by reversing the delayed clock input signal.

3. The apparatus as recited in claim 1, wherein the delay line unit comprises:
   a third controlling means for generating a first control signal which controls a delay amount according to the first detection signal and outputting the generated first control signal;
   a first shift register for receiving the first control signal and outputting the third control signal that controls a delay amount by shifting the external clock signal to right or left according to the first control signal;
   a third delay line for receiving the third control signal and the external clock signal from the buffer, generating the first delayed internal clock signal by delaying the first internal clock signal as much as a predetermined delay amount according to the third control signal and outputting the first delayed internal clock signal to the blend circuit;
   a fourth controlling means for generating a second control signal that control a delay amount according to the second detection signal and outputting the second control signal;
   a second shift register for receiving the second control signal and generating a fourth control signal that controls a delay amount by shifting and outputting the fourth control signal; and
   a fourth delay line for receiving the fourth control signal and outputting the second delayed internal clock signal that controls a delay amount by shifting the external clock signal to right or left according to the fourth control signal.

4. The apparatus as recited in claim 3, wherein the third delay line comprises:

a coarse delay line having a plurality of unit delay cells, which are coupled in order to generate a first mixer input signal and a second mixer input signal, wherein the first mixer input signal and the second mixer input signal have a delay difference as much as one unit delay cell in the coarse delay line; and a first phase mixer for receiving the first and second mixer input signals from the coarse delay line and tuning minutely the delay amount.

5. The apparatus as recited in claim 4, wherein the first phase mixer comprises:

a plurality of first mixing cells for receiving a control signal from the third controlling means or the fourth control means to a port and the first mixed input signal from the coarse delay line to another port and outputting an High-z signal in case that the control signal is low and in case that the control signal is high, outputting the first mixed input signal;

a plurality of second mixing cells for receiving the second mixer input signal from the coarse delay line to a port and the control signal from the third controlling means or the fourth control means to other port and outputting an High-z signal in case that the control signal is low and outputting the second mixer input signal; and an inverter for reversing an output signal from the plurality of first mixed cell and the plurality of second mixed cell according to the control signal and outputting a reversed output signal to the blend circuit.

6. The apparatus as recited in claim 5, wherein the first mixing cell comprises:

a first PMOS transistor having a source port coupled to a electric voltage and an gate port for receiving one of the first mixer input signal and the second mixer input signal from the coarse delay line as an mixer input signal;

a second PMOS transistor having a source port coupled to a drain port of the first PMOS transistor, a gate port receiving a reversed signal of the control signal and a drain port coupled to the output port;

a first NMOS transistor having a source port coupled to a ground and a gate port receiving the mixer input signal; and a second NMOS transistor having a source port coupled to a drain port of the first NMOS transistor, a gate port receiving the control signal and a drain port coupled to the output port.

7. The apparatus as recited in claim 5, wherein the second mixing cell comprises:

a first PMOS transistor having a source port coupled to a electric voltage and a gate port for receiving one of the first mixer input signal and the second mixer input signal from MUX as an mixer input signal;

a second PMOS transistor having a source port coupled to a drain port of the first PMOS transistor, a gate port receiving a reversed signal of the control signal and a drain port coupled to the output port;

a first NMOS transistor having a source port coupled to a ground and a gate port receiving the mixer input signal from the MUX; and a second NMOS transistor having a source port coupled to a drain port of the first NMOS transistor, a gate port receiving the control signal and a drain port coupled to the output port.

8. The apparatus as recited in claim 3, wherein the fourth delay line comprises:

a coarse delay line having a plurality of unit delay cells, which are coupled in order to generate and output a first mixer input signal and a second mixer input signal, wherein the first mixer input signal and the second mixer input signal have a delay difference as much as one unit delay cell in the coarse delay line; and a first phase mixer for receiving the first and second mixer input signals from the coarse delay line and tuning minutely the delay amount.

9. The apparatus as recited in claim 1, wherein the delay line unit comprises:

a fifth controlling means for generating a fifth control signal that controls a delay amount according to the first detection signal;

a plurality of delay cells for receiving the first internal clock signal from the buffer and generating a plurality of phase delayed signals by passing the first internal clock signal through the plurality of delay cells;

a first signal generating means for generating the first delayed internal clock signal by selecting and tuning two neighbor phase delayed signals among the plurality of phase delayed signals according to the fifth control signal and outputting the first delayed internal clock signal to the blend circuit;

a sixth controlling means for generating a sixth control signal that controls a delay amount according to the second detection signal and outputting the sixth control signal; and a second signal generating means for generating the second delayed internal clock signal by selecting and tuning two neighbor phase delayed signals among the plurality of phase delayed signals according to the sixth control signal and outputting the second delayed internal clock signal to the blended circuit.

10. The apparatus as recited in claim 9, wherein the first signal generating means includes;

a MUX for receiving the plurality of phase delayed signals and selecting two neighbor phase delayed signals, which have a difference of delay amount as much as one unit delay cell, among the plurality of phase delayed signals according to fifth control signal; and a second phase mixer for mixing the two neighbor phase delayed signals from the MUX in order to generate the first delayed internal clock signal by matching the phase of the two neighbor phase delayed signals and outputting the first delayed internal clock signal.

11. The apparatus as recited in claim 10, wherein the second phase mixer comprises:

a plurality of first mixing cells for receiving a control signal from the third controlling means or the fourth control means to a port and the first mixed input signal from the coarse delay line to another port and outputting an High-z signal in case that the control signal is low and in case that the control signal is high, outputting the first mixed input signal;

a plurality of second mixing cells for receiving the second mixer input signal from the coarse delay line to a port and the control signal from the third controlling means or the fourth control means to other port and outputting an High-z signal in case that the control signal is low and outputting the second mixer input signal; and an inverter for reversing an output signal from the plurality of first mixed cell and the plurality of second mixed cell according to the control signal and outputting a reversed output signal to the blend circuit.

12. The apparatus as recited in claim 11, wherein the first mixing cell comprises:
- a first PMOS transistor having a source port coupled to a electric voltage and a gate port for receiving one of the first mixer input signal and the second mixer input signal from the coarse delay line as an mixer input signal;
- a second PMOS transistor having a source port coupled to a drain port of the first PMOS transistor, a gate port receiving a reversed signal of the control signal and a drain port coupled to the output port;
- a first NMOS transistor having a source port coupled to a ground and a gate port receiving the mixer input signal; and
- a second NMOS transistor having a source port coupled to a drain port of the first NMOS transistor, a gate port receiving the control signal and a drain port coupled to the output port.

13. The apparatus as recited in claim 11, wherein the second mixing cell comprises:
- a first PMOS transistor having a source port coupled to a electric voltage and a gate port for receiving one of the first mixer input signal and the second mixer input signal from MUX as an mixer input signal;
- a second PMOS transistor having a source port coupled to a drain port of the first PMOS transistor, a gate port receiving a reversed signal of the control signal and a drain port coupled to the output port;
- a first NMOS transistor having a source port coupled to a ground and a gate port receiving the mixer input signal from the MUX; and
- a second NMOS transistor having a source port coupled to a drain port of the first NMOS transistor, a gate port receiving the control signal and a drain port coupled to the output port.

14. The apparatus as recited in claim 9, wherein the second signal generating means
- a MUX for receiving the plurality of phase delayed signals and selecting two neighbor phase delayed signals, which have a difference of delay amount as much as one unit delay cell, among the plurality of phase delayed signals according to fifth control signal; and
- a second phase mixer for mixing the two neighbor phase delayed signals from the MUX in order to generate the first delayed internal clock signal by matching the phase of the two neighbor phase delayed signals and outputting the first delayed internal clock signal.

15. The apparatus as recited in claim 1, the blend circuit includes:
- a second inverter for receiving a blended enable signal and outputting the reversed blended enable signal by reversing the received blended enable signal;
- a first clock signal processing unit for receiving the blended enable signal, outputting the received blended enable signal when the blended enable signal is a second logical state and generating a first blended signal by using the first delayed internal clock signal when the blended enable signal is a first logical state;
- a second clock signal processing unit for being un-activated when the blended enable signal is a second logical state and generating a second blended signal by using a second delayed internal clock signal when the blended enable signal is a first logical state; and
- a third inverter for reversing one of the first blended signal and the second blended signal, which is outputted one of the first and second clock signal according to the blended enable signal.

16. The apparatus as recited in claim 15, wherein the first clock signal processing unit further comprises:
- k number of first controllable inverters which are always operated as an inverter; and
- n-k number of second controllable inverters which are operated as an inverter when the blended enable signal is the second logical state and which is turned off when the blended enable signal is the first logical state.

17. The apparatus as recited in claim 16, wherein the first controllable inverter and the second controllable inverter are equal.

18. The apparatus as recited in claim 16, wherein the number first controllable inverters and the number of second controllable inverters are equal in the number.

19. The apparatus as recited in claim 15, wherein the second clock signal processing unit comprises:
- k number of third control inverters, which are always turned off; and
- n-k number of fourth control inverters, which are operated as an inverter when the blended enable signal is the first logical state and which are turned off in case that the blended enable signal is the second logical state.

20. The apparatus as recited in claim 19, wherein the third control inverters and fourth control inverters are equal in size.

21. The apparatus as recited in claim 19, wherein the number of the third control inverters and fourth control inverters are equal in the number.

22. A method of correcting a duty cycle comprising:
a) determining whether rising edges of an external clock signal and a compensate clock signal are identically matched;
b) activating a second delayed internal clock signal when the rising edges are identically matched;
c) determining whether rising edges of a first delayed internal clock signal and the second delayed internal clock signal are identically matched; and
d) generating a blended clock signal having 50% duty cycle by blending phases of the first delayed internal clock signal and second delayed internal clock signal in case that rising edges of the first clock signal and second clock signal are matched identically.

23. The method as recited in claim 22, further comprising:
e) matching rising edges of the external clock signal and compensate clock signal by delaying the compensate clock when the rising edges of the external clock signal and compensate clock signal are not matched and returning back to the step a).

24. The method as recited in claim 22, further comprising:
f) matching edges of the first delayed internal clock signal and second delayed internal clock signal by delaying the first and second delayed internal clock signals in case that the rising edges of the first clock signal and second clock signal are not matched and returning back to the step c).

* * * * *

UNITED STATES PATENT AND TRADEMARK OFFICE
CERTIFICATE OF CORRECTION

PATENT NO. : 6,677,792 B2
DATED : January 13, 2004
INVENTOR(S) : Jong-Tae Kwak

It is certified that error appears in the above-identified patent and that said Letters Patent is hereby corrected as shown below:

Title page,
Item [75], Inventor, after "Jong-Tae Kwak," please delete "Ichon-shi" and insert -- Kyoungki-do -- in its place.

Column 12,
Line 10, after "delayed internal," please delete "clocks" and insert -- clock -- in its place Column 13,
Line 32, after "Electric voltage," please delete "and an gate" and insert -- and a gate -- in its place.
Line 51, after "coupled to," please delete "a electric" and insert -- an electric -- in its place.

Column 15,
Lines 3 and 22, after "coupled to," please delete "a electric" and insert -- an electric -- in its place.
Line 38, after "generating means" please insert -- includes: --.
Line 60, after "by using," please delete "the first" and insert -- a first -- in its place.

Column 16,
Line 19, please delete "number first" and insert -- number of first -- in its place.

Signed and Sealed this

Fourth Day of May, 2004

JON W. DUDAS
*Acting Director of the United States Patent and Trademark Office*